United States Patent
Kim et al.

(10) Patent No.: US 6,500,736 B2
(45) Date of Patent: Dec. 31, 2002

(54) CRYSTALLIZATION METHOD OF AMORPHOUS SILICON

(75) Inventors: Hae-Yeol Kim, Gyeonggi-do (KR); Binn Kim, Seoul (KR); Joon-young Yang, Gyeonggi-do (KR); Sang-Soo Han, Gyeonggi-do (KR)

(73) Assignee: .5qLG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/998,338

(22) Filed: Dec. 3, 2001

(65) Prior Publication Data
US 2002/0086468 A1 Jul. 4, 2002

(30) Foreign Application Priority Data
Dec. 29, 2000 (KR) .............................. 00-85413

(51) Int. Cl.$^7$ .................. H01L 21/20; H01L 21/36; H01L 21/00; H01L 21/84
(52) U.S. Cl. .................. 438/486; 438/156; 438/166; 438/795
(58) Field of Search ................ 438/156, 149, 438/166, 482, 485, 486, 795, 976

(56) References Cited
U.S. PATENT DOCUMENTS

| | | | | |
|---|---|---|---|---|
| 5,403,772 A | * | 4/1995 | Zhang et al. | 117/8 |
| 6,197,624 B1 | * | 3/2001 | Yamazaki | 438/158 |
| 6,309,951 B1 | * | 10/2001 | Jang et al. | 438/166 |
| 6,326,226 B1 | * | 12/2001 | Jang et al. | 438/486 |
| 6,342,409 B1 | * | 1/2002 | Seo | 438/161 |

OTHER PUBLICATIONS

Pelant et al., Electric Field–Enhanced metal–induced crystallization of hydrogenated amorphous silicon at room temperature, 2001, Appl. Phys. A.*

* cited by examiner

*Primary Examiner*—Richard Elms
*Assistant Examiner*—Adam Pyonin
(74) *Attorney, Agent, or Firm*—Morgan, Lewis & Bockius LLP

(57) ABSTRACT

A method of crystallizing amorphous silicon using a metal catalyst. More specifically, the method includes forming an amorphous silicon layer over a substrate, forming a plurality of metal clusters on the amorphous silicon film, forming a heat insulating layer on the amorphous silicon layer including the metal clusters, disposing a pair of electrodes on the heat insulating layer, simultaneously applying a thermal treatment and a voltage to crystallize the amorphous silicon, and removing the heat insulating layer including the electrodes from the substrate.

15 Claims, 5 Drawing Sheets

CRYSTALLIZATION METHOD OF AMORPHOUS SILICON

This application claims the benefit of Korean Application No. P2000-85413 filed on Dec. 29, 2000, which is hereby incorporated by reference.

BACKGROUND OF THE INVENTION

1. Field of the Invention

The present invention relates to a method for crystallization, and more particularly, to a crystallization method of an amorphous silicon. Although the present invention is suitable for a wide scope of applications, it is particularly suitable for forming polysilicon that has uniform grains by using a metal catalyst to enhance crystallization.

2. Discussion of the Related Art

Due to a rapid development in information technologies, display devices are developed in accordance with the pace of the technology development. Display devices process and display a great deal of information. A cathode ray tube (CRT) has served as a mainstream of the display devices. To meet the needs of the current technology break-through, a flat panel display device having small size, light weight, and low power consumption is a more important area in research.

In general, liquid crystal display (LCD) devices make use of optical anisotropy and polarization characteristics of liquid crystal molecules to control an arrangement in orientation. The arrangement direction of the liquid crystal molecules can be controlled by applying an electric field. Accordingly, when the electric field is applied to the liquid crystal molecules, the arrangement of the liquid crystal molecules changes. Since refraction of incident light is determined by the arrangement of the liquid crystal molecules, display of image data can be controlled by changing the electric field applied to the liquid crystal molecules.

As an active layer of a thin film transistor (TFT) in an array substrate for use in liquid crystal display (LCD) devices, amorphous silicon (a-Si) is widely used. This is because amorphous silicon can be formed on the low cost glass substrate at a low temperature in fabricating a large LCD panel. However, a driving circuit is required to drive the thin film transistors including amorphous silicon.

As well known, the liquid crystal display device includes an array substrate, and the array substrate is electrically connected to large scale integrated circuit (LSIC) fabricated by the single crystal silicon, using a tape automated bonding (TAB) method. The driving circuit, however, is very expensive, and thus the liquid crystal display including the large scale integration costs also high.

Accordingly, the thin film transistor (TFT) formed of polycrystalline silicon (poly-Si) for fabricating a liquid crystal display device has been researched and developed. In the liquid crystal display device employing poly-Si in a thin film transistor, the thin film transistor and the driving circuit can be formed on the same substrate. Thus, it is not necessary for the driving circuit to be connected to the thin film transistor. Further, it is easy to obtain a fast response time in display when using the polycrystalline silicon as an element of the TFT rather than the amorphous silicon as an element of the TFT. Namely, a field effect mobility in poly-Si is 100 to 200 times faster than that in a-Si. Additionally, the poly-Si has a good stability against light and temperature variations.

In the view of the foregoing, various methods for forming the poly-Si are well known. Of the different types of methods for forming poly-Si, a method for crystallizing a-Si after depositing a-Si using plasma enhanced chemical vapor deposition (PECVD) or low pressure chemical vapor deposition (LPCVD) is widely known and employed in the crystallization of a-Si. Furthermore, as a method for forming poly-Si from a-Si, for example, a solid phase crystallization (SPC), an excimer laser crystallization (ELC) or a metal induced crystallization (MIC) has been employed.

In the process of the solid phase crystallization (SPC), amorphous silicon is exposed to heat approaching about 600 degrees celsius for at least several hours. Namely, the solid phase crystallization (SPC) is to change amorphous silicon into polycrystalline silicon by a heat-treatment at a high temperature for a long time in a furnace. It requires forming a buffer layer on the quartz substrate having a thermal endurance over temperatures of 600 degrees celsius (° C.) in order to prevent the quartz substrate from diffusing out impurities. The amorphous silicon layer is deposited on the buffer layer and introduced by the heat-treatment.

The solid phase crystallization (SPC) method, however, results in an irregular grain growth and irregular grain boundaries so that the gate insulating layer on the polycrystalline silicon layer grows erratically, thereby lowering a breakdown voltage of the device. In addition, since the grain sizes of the polycrystalline silicon are excessively non-uniform, electrical characteristics, such as current and a threshold voltage, are not good. Further, a costly quartz substrate should be employed.

The excimer laser crystallization (ELC) process has also been used with some advantages in annealing amorphous silicon. Laser allows areas of the amorphous film to be exposed to very high temperatures for very short periods of time. Theoretically, this offers a possibility of annealing the amorphous silicon at an optimum temperature (less than 400 degrees celsius) without degrading the transparent substrate upon which it is mounted. However, use of this method has been limited by the lack of control over some of the process steps. Typically, an aperture size of the laser is relatively small. The aperture size, power of the laser, and a thickness of the film may require multiple laser passes, or shots, to complete an annealing process. Since it is difficult to precisely control the laser, the multiple shots introduce non-uniformities into the annealing process. Further, the substrates must be annealed serially, instead of in a furnace. TFTs made by this method are significantly more expensive than those made by direct deposition or SPC.

A metal induced crystallization is another example of a method for crystallizing amorphous silicon at a low temperature. In the metal induced crystallization, metal, such as nickel (Ni), is disposed on the amorphous silicon layer, and then lowers the crystallization temperature of the amorphous silicon.

For a more complete understanding of the metal induced crystallization, detailed descriptions will be referenced to the accompanying drawings as follows.

FIGS. 1A to 1C are perspective views showing conventional crystallization process steps of an amorphous silicon layer according to a conventional metal induced crystallization method.

Initially, referring to FIG. 1A, a buffer layer 20 is formed on a substrate 10, and then an amorphous silicon layer 30 is formed on the buffer layer 20 using plasma enhanced chemical vapor deposition (PECVD). In FIG. 1B, a transition metal 40, such as nickel (Ni), is deposited on the entire surface of the amorphous silicon layer by evaporation, sputtering, or CVD.

Thereafter, a pair of electrodes 50, as shown in FIG. 1C, are positioned on the amorphous silicon layer 30 including the transition metal 40. After forming the electrodes 50 on the amorphous silicon layer 30, including the transition metal 40, the substrate 10 having the buffer layer 20, the amorphous silicon film 30, and the transition metal 40 is then subjected to a thermal treatment with a temperature of approximately 500 degrees Celsius while a voltage is applied to the electrodes 50.

During the metal induced crystallization, nickel (Ni) on the amorphous silicon layer 30 begins to react with the amorphous silicon at a temperature of about 200 degrees celsius, and then is transformed into silicide. At the beginning of the reaction, nickel (Ni) can be easily silicified by heating at about 200 degrees celsius to be $Ni_2Si$. As the temperature increases, nickel (Ni) becomes nickel monosilicide (NiSi), and finally nickel disilicide ($NiSi_2$). The final phase, nickel disilicide ($NiSi_2$), is the most stable state.

As a result, the amorphous silicon is crystallized into polycrystalline silicon (poly-Si) at a temperature of about 500 degrees celsius due to the nickel disilicide ($NiSi_2$) acting as a nuclei in crystallization. When crystallizing the amorphous silicon layer 30, if a voltage is applied to the electrodes 50, crystallization of the amorphous silicon is enhanced because a mobility of the nickel disilicide ($NiSi_2$) is promoted. Thus, the poly-Si layer can be formed at a low temperature over the low cost glass substrate.

However, there are some problems in the conventional metal induced crystallization (MIC). Since the metallic material layer functioning as a metal catalyst remains in the silicon layer even after the crystallization, the residual metal modifies intrinsic characteristics of the silicon layer. In order to overcome this problem, an infinitesimal quantity of metal is required. However, the metal and the amorphous silicon are easily oxidized by oxygen. Namely, the metal is combined with the oxygen in the atmosphere, or the surface of the amorphous silicon layer is oxidized, thereby decreasing the crystallization speed of the amorphous silicon.

Furthermore, during the crystallization processes, heat loss occurs in the entire surface of the amorphous silicon layer. Therefore, the crystallization is performed at a temperature of about 500 degrees celsius, and then the poly-Si layer has irregular or non-uniform grains after the crystallization due to the irregular distribution in temperature of the amorphous silicon layer.

SUMMARY OF THE INVENTION

Accordingly, the present invention is directed to a crystallization method of an amorphous silicon that substantially obviates one or more of problems due to limitations and disadvantages of the related art.

Another object of the present invention is to provide a crystallization method of an amorphous silicon into a polycrystalline silicon, which enhances crystallization speed and suppresses heat loss in the amorphous silicon.

Another object of the present invention is to provide a crystallization method of an amorphous silicon at a relatively low temperature.

A further object of the present invention is to provide a crystallization method of an amorphous silicon into a polycrystalline silicon that has uniform grains.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method for crystallizing amorphous silicon includes forming an amorphous silicon layer over a substrate, forming a plurality of metal clusters on the amorphous silicon layer, forming a heat insulating layer on the amorphous silicon layer including the first metal, disposing a pair of electrodes on the heat insulating layer, crystallizing the amorphous silicon layer using a thermal treatment, and removing the heat insulating layer including the electrodes from the substrate.

In the method in the present invention, the heat insulating layer is formed of one of silicon oxide ($SiO_2$) and silicon nitride ($SiN_x$). The heat insulating layer is removed by using one of dry etching and wet etching. The first metal layer includes a transition metal selected from a group consisting of nickel (Ni), iron (Fe) and cobalt (Co). The thermal treatment is performed at a temperature of less than about 500 degrees celsius.

The method for crystallizing amorphous silicon further includes forming a buffer layer between the substrate and the amorphous silicon layer. Here, the buffer layer is formed of silicon oxide ($SiO_2$).

The method for crystallizing amorphous silicon layer further includes forming a second metal layer on the heat insulating layer, and removing the metal layer after crystallizing the amorphous silicon layer. The second metal layer is formed of a metallic material selected from a group consisting of nickel (Ni), cobalt (Co), molybdenum (Mo), chrome (Cr) and iron (Fe). The thermal treatment is performed at a temperature of less than about 450 degrees celsius.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the drawings.

DETAILED DESCRIPTION OF THE ILLUSTRATED EMBODIMENTS

Reference will now be made in detail to the illustrated embodiments of the present invention, examples of which are illustrated in the accompanying drawings. Wherever possible, the same reference numbers will be used throughout the drawings to refer to the same or like parts.

FIGS. 2A to 2E are perspective views showing crystallization process steps of an amorphous silicon layer according to a first embodiment of the present invention.

Figure 1A:
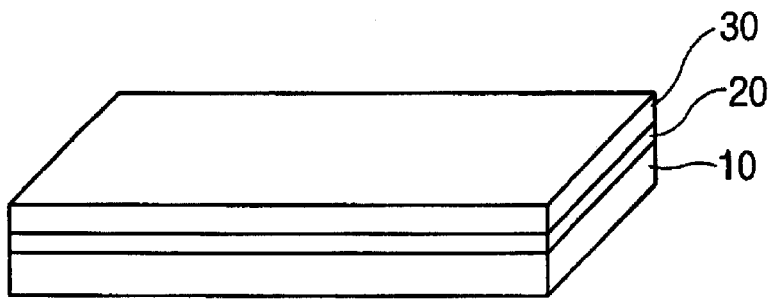
FIGS. 1A to 1C are perspective views showing conventional crystallization process steps of an amorphous silicon layer according to a conventional metal induced crystallization method.
Figure 1B:
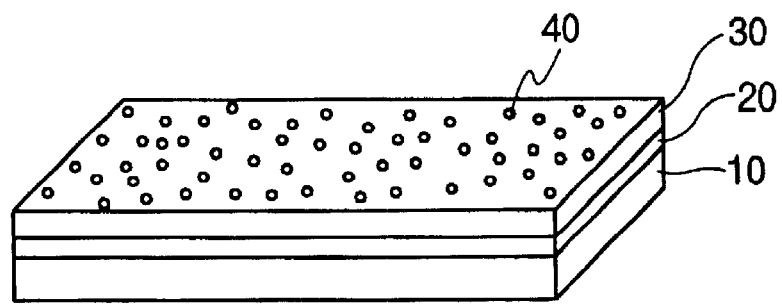
Figure 1C:
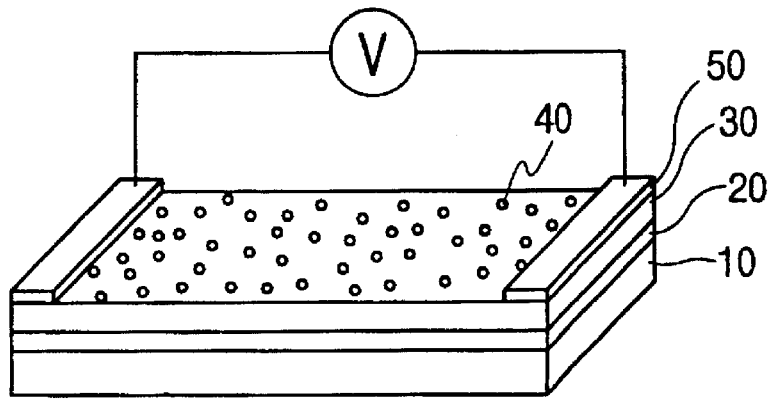
Figure 2A:
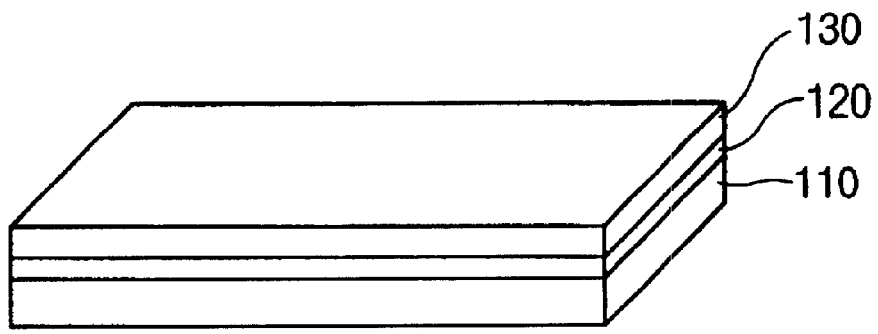
FIGS. 2A to 2E are perspective views showing crystallization process steps of an amorphous silicon layer according to a first embodiment of the present invention.

Initially, referring to FIG. 2A, a buffer layer 120 is formed on a substrate 110, and then an amorphous silicon layer 130 is formed on the buffer layer 120 using plasma enhanced chemical vapor deposition (PECVD). The substrate 110 may be a low cost glass substrate for a large size. Additionally, various different kinds of substrates may be used as the substrate 110 in this present invention. The buffer layer 120 formed on the substrate 110 acts for preventing the substrate 110 from diffusing impurities into the amorphous silicon layer 130. In this present invention, silicon oxide ($SiO_2$) may be used as the buffer layer 120.

Figure 2B:
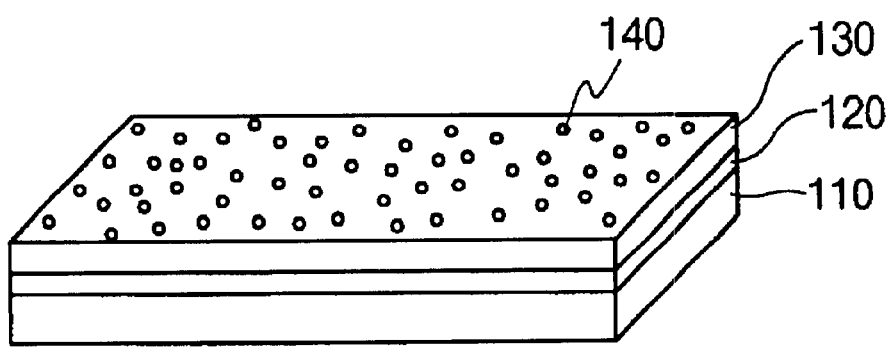

In FIG. 2B, a transition metal 140, such as nickel (Ni), is deposited on the entire surface of the amorphous silicon layer 130 by evaporation, sputtering, or chemical vapor deposition (CVD). For the transition metal 140, iron (Fe), paladium (Pd) or cobalt (Co) may also be selected. In other words, amorphous silicon is brought into contact with the transition metal, such as nickel (Ni), iron (Fe), and cobalt (Co), in order to lower a crystallization temperature. The transition metal 140 is formed on the amorphous silicon layer 130 as a sub-monolayer, so that it is formed as metal clusters. For example, the transition metal 140 may have a density of about $5\times10^{13}$ to $1\times10^{19}/cm^2$.

For example, in nickel-induced crystallization, the final nickel silicide phase, such as nickel disilicide ($NiSi_2$), acts as a crystal seed that promotes a polycrystalline silicon growth. The nickel disilicide ($NiSi_2$) has a silicon-like structure with a lattice constant of 5.405 angstroms (Å), approximate to that of silicon (5.430 angstroms (Å)). The nickel disilicide ($NiSi_2$) accelerates the transformation of amorphous silicon into polycrystalline silicon.

Figure 2C:
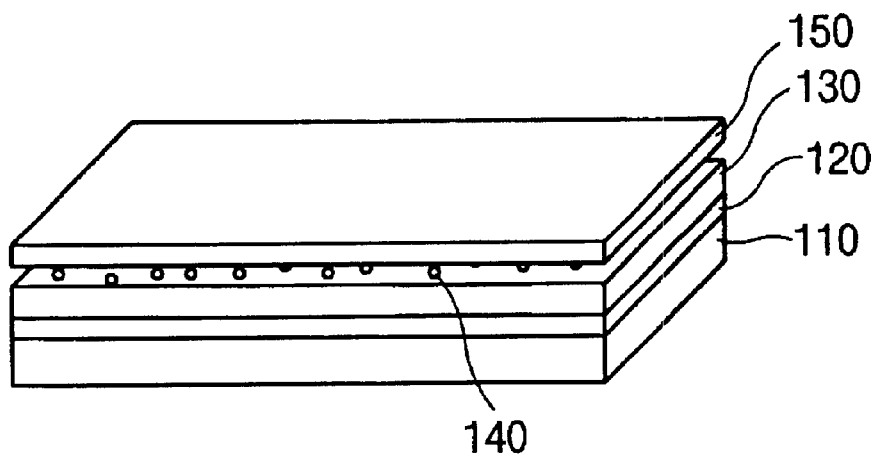

Now, referring to FIG. 2C, a heat insulating layer 150 is formed on the amorphous silicon layer 130 including the transition metal 140. Silicon nitride ($SiN_x$) or silicon oxide ($SiO_2$) may be selected for the heat insulating layer 150. In the present invention, the heat insulating layer 150 suppresses heat loss from the surface of the amorphous silicon layer 130. Although FIG. 2C shows a gap between the amorphous silicon layer 130 and the heat insulation layer 150, it is exaggerated to illustrate the transition metal 140, and the heat insulation layer 150 is actually formed on the entire surface of the amorphous silicon layer 130, completely covering the transition metal 140.

Figure 2D:
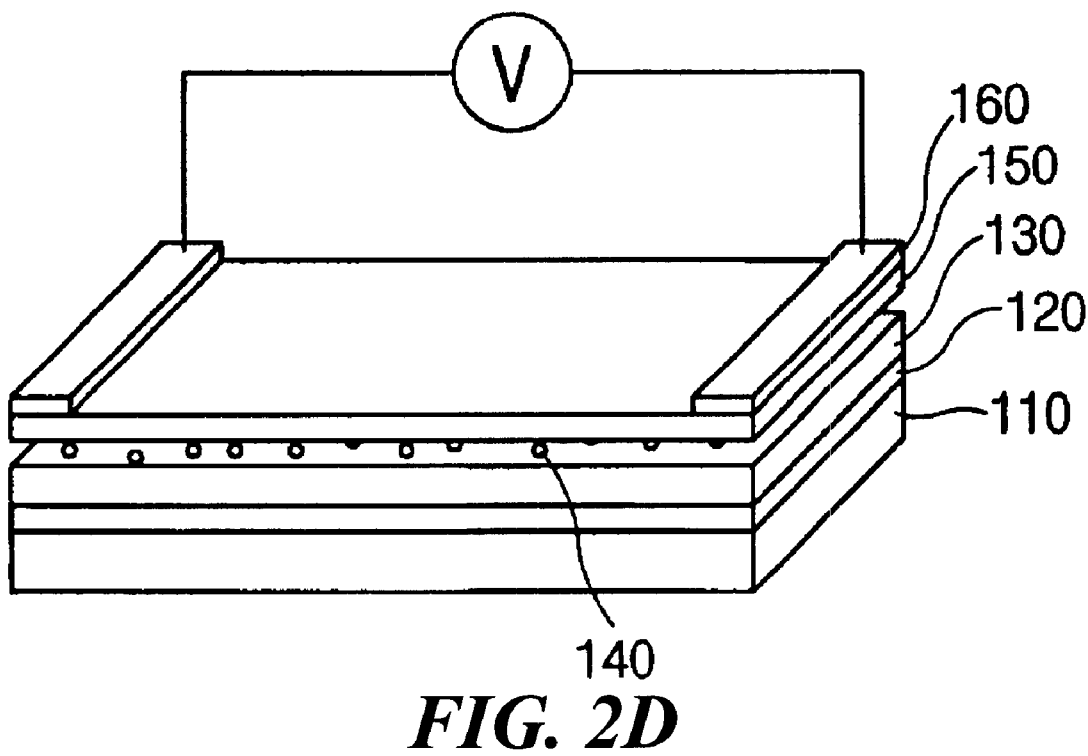

In FIG. 2D, a pair of electrodes 160 are disposed on the heat insulating layer 150 in order to accelerate the crystallization of the amorphous silicon by applying a voltage. Either a DC or AC potential may be applied for this purpose. For example, about 10 to 500 V/cm may be applied for the DC voltage. After positioning the electrodes 160 on the heat insulating layer 150, the substrate 110 is then subjected to a thermal treatment with a temperature of less than 500 degrees celsius while the voltage is applied to the electrodes 160. Since the heat insulation layer 150 is disposed on the amorphous silicon layer 130 including the transition metal 140, oxidations of the amorphous silicon layer 130 and the transition metal 140 are prevented. Furthermore, since the heat insulation layer 150 suppresses the heat loss from the surface of the amorphous silicon layer 130, a poly-Si layer having uniform grains is formed at a temperature of less than about 500 degrees celsius. If the heat insulation layer 150 is too thick when the heat insulation layer 150 is formed thereon, electric field becomes too weak between the pair of the electrodes 160. Thus, a thickness of the heat insulation layer 150 should be less than about 2,000 angstroms (Å).

Figure 2E:
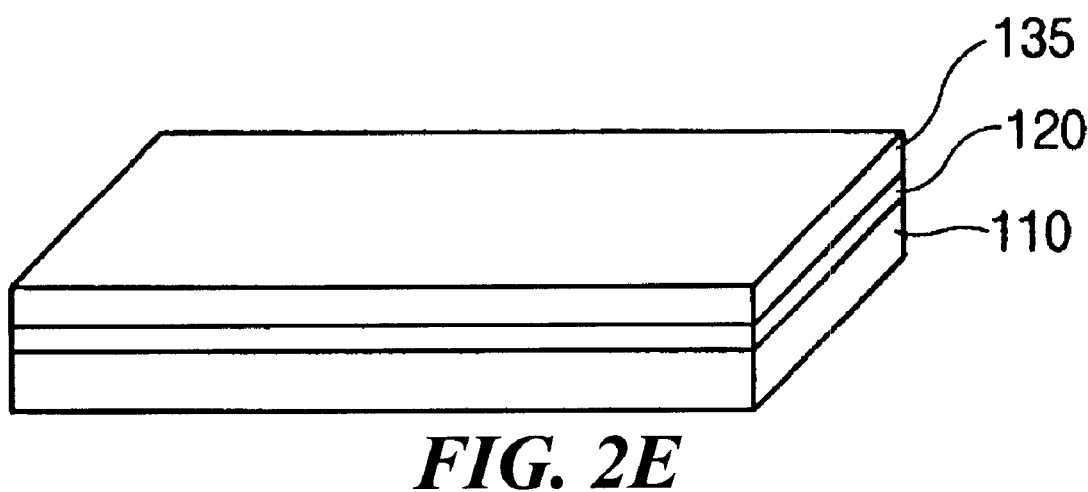

In FIG. 2E, after forming a poly-Si layer 135 on the buffer layer 120, the heat insulation layer 150 on the poly-Si layer 135 is removed by using dry etching or wet etching.

As described above, the poly-Si layer having uniform grains may be formed at a temperature of less than about 500 degrees celsius using the heat insulating layer according to the first embodiment of the present invention.

FIGS. 3A to 3E are perspective views showing crystallization process steps of an amorphous silicon layer according to a second embodiment of the present invention. In the second embodiment, a poly-Si layer is formed at a temperature lower than that of the first embodiment.

Figure 3A:
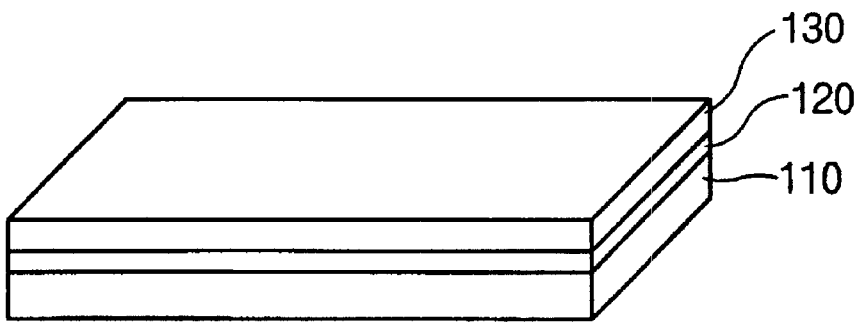
FIGS. 3A to 3E are perspective views showing crystallization process steps of an amorphous silicon layer according to a second embodiment of the present invention.

Referring to FIG. 3A, a buffer layer 120 is formed on a substrate 110, and then an amorphous silicon layer 130 is formed on the buffer layer 120 using plasma enhanced chemical vapor deposition (PECVD).

Figure 3B:
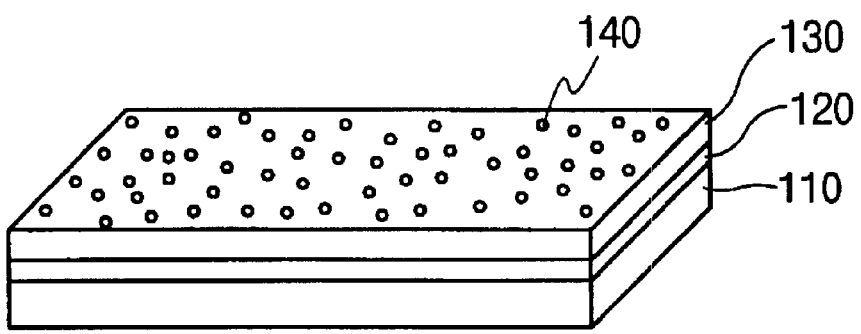

In FIG. 3B, a transition metal 140, such as nickel (Ni), paladium (Pd), iron (Fe), and cobalt (Co), is deposited on the entire surface of the amorphous silicon layer 130 by one of evaporation, sputtering, and chemical vapor deposition (CVD).

Figure 3C:
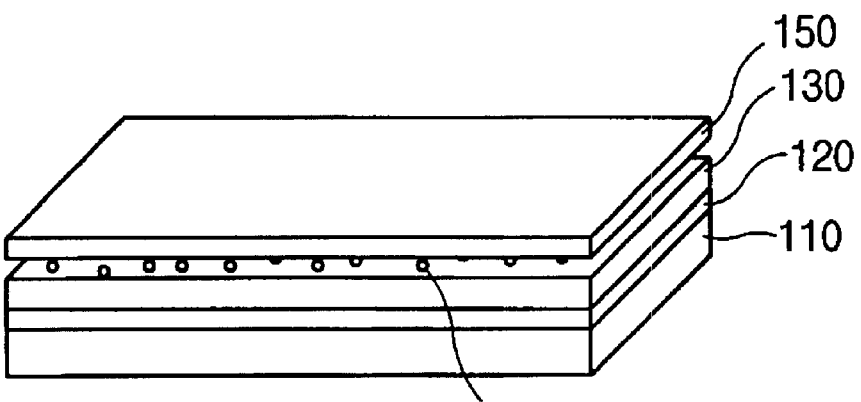

As shown in FIG. 3C, a heat insulating layer 150 is formed on the amorphous silicon layer 130 including the transition metal 140. Silicon nitride ($SiN_x$) or silicon oxide ($SiO_2$) may be selected for the heat insulating layer 150. In the second embodiment, the heat insulating layer 150 and a metal layer formed in a later step suppress the heat loss from the surface of the amorphous silicon layer 130. Although FIG. 3C shows a gap between the amorphous silicon layer 130 and the heat insulation layer 150, it is exaggerated to illustrate the transition metal 140, and the heat insulation layer 150 is actually formed on the surface of the amorphous silicon layer 130, completely covering the transition metal 140.

Figure 3D:
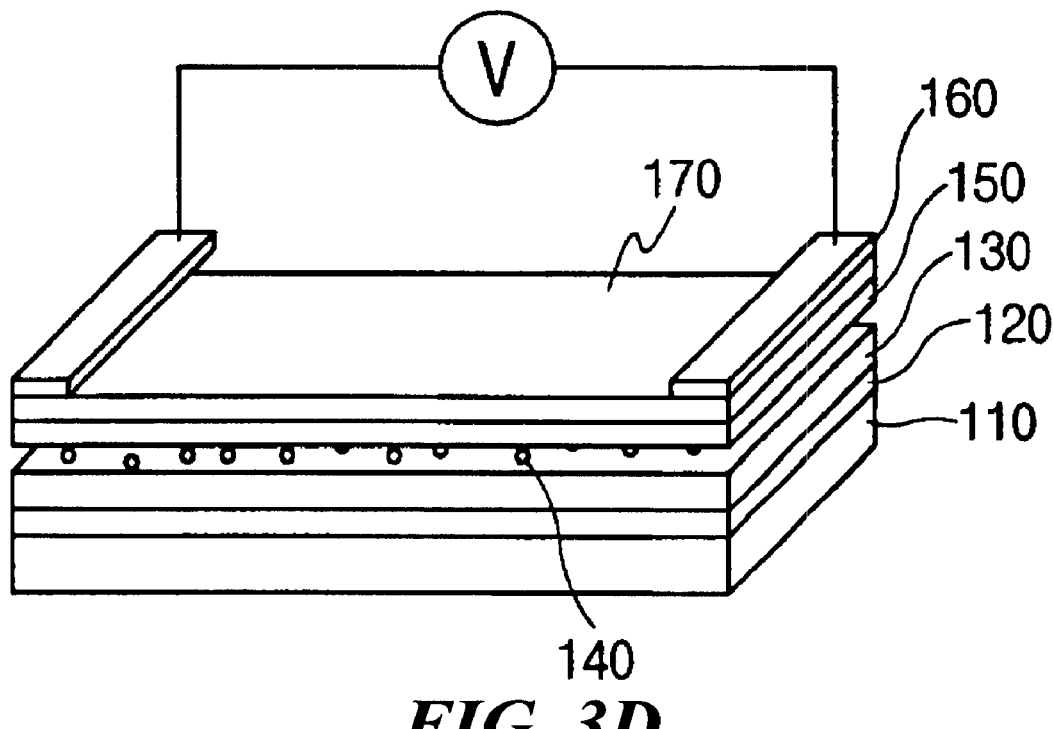

Now, referring to FIG. 3D, a metal layer 170 is formed on the heat insulation layer 150, and then a pair of electrodes 160 are formed at both sides of the metal layer 170 in order to accelerate the crystallization of the amorphous silicon by applying a voltage. As a metallic material 170, any metal layer may be selected. Molybdenum (Mo), chrome (Cr), iron (Fe) and cobalt (Co) are examples for the metallic material 170. After disposing the electrodes 160 on the metal layer 170, the substrate 110 including the entire elements formed thereon is then subjected to a thermal treatment with a temperature of less than about 450 degrees celsius while the voltage is applied to the electrodes 160. Unlike the first embodiment, since the electrodes 160 are adjacent to the metal layer 170 at the both sides, Joule's heat occurs in the metal layer 170. Since the metal layer 170 is formed on the heat insulation layer 150 and connected to the electrodes 160, Joule's heat is delivered to the surface of the amorphous silicon layer 130. As a result, heat loss from the amorphous silicon layer 130 may be minimized. Therefore, the amorphous silicon layer 130 is crystallized at a temperature of less than about 450 degrees celsius. The heat insulation layer 150 has a thickness of less than about 2,000 angstroms (Å) in the second embodiment.

Figure 3E:
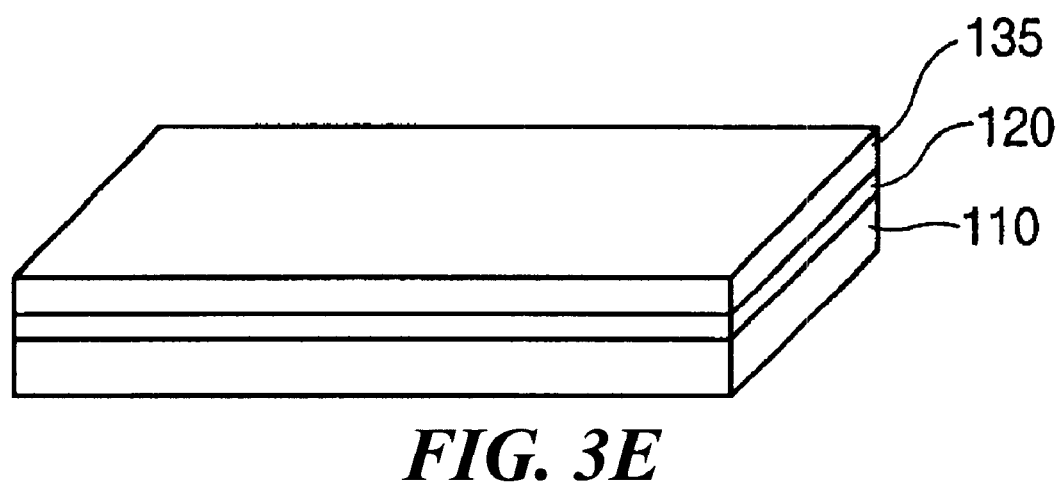

Now, referring to FIG. 3E, after forming a poly-Si layer 135 on the buffer layer 120, both the heat insulation layer 150 and the metal layer 170 are removed by using dry etching or wet etching.

As aforementioned, since the heat insulation layer 150 is formed on the amorphous silicon layer when crystallizing the amorphous silicon layer into the poly-Si layer, heat loss from the surface of the amorphous silicon film and oxidation of amorphous silicon and transition metal are prevented. Thus, the poly-Si layer having uniform grains is formed at a relatively low temperature.

Moreover, according to the second embodiment, since the metal layer is additionally formed on the heat insulation layer and electrically connected to the electrodes, the amorphous silicon layer is heated by Joule's heat caused by the applied voltage through the electrodes. Therefore, the crystallizing temperature of the second embodiment is lower than that of the first embodiment It will be apparent to those skilled in the art that various modifications and variations can be made in the crystallization method of the amorphous silicon of the present invention without departing from the spirit or scope of the inventions. Thus, it is intended that the present invention covers the modifications and variations of this invention provided they come within the scope of the appended claims and their equivalents.

What is claimed is:

1. A method of crystallizing amorphous silicon on a substrate, comprising:

forming an amorphous silicon layer over the substrate;

forming a plurality of metal clusters on the amorphous silicon layer;

forming a heat insulating layer on the amorphous silicon layer including the metal clusters;

disposing a pair of electrodes on the heat insulating layer;

simultaneously applying a thermal treatment and a voltage to crystallize the amorphous silicon layer; and removing the heat insulating layer including the electrodes from the substrate.

2. The method of claim 1, wherein the heat insulating layer is formed of one of silicon oxide ($SiO_2$) and silicon nitride ($SiN_x$).

3. The method of claim 1, wherein the removing the heat insulating layer is executed by using one of dry etching and wet etching.

4. The method of claim 1, wherein the metal clusters include a transition metal.

5. The method of claim 4, wherein the metal cluster layer is selected from a group consisting of nickel (Ni), paladium (Pd), iron (Fe), and cobalt (Co).

6. The method of claim 1, wherein the thermal treatment is performed at a temperature of less than about 500 degrees celsius.

7. The method of claim 1, further comprising forming a buffer layer between the substrate and the amorphous silicon layer.

8. The method of claim 7, wherein the buffer layer is formed of silicon oxide ($SiO_2$).

9. The method of claim 1, wherein the applied voltage is in the range of about 10 to 500 V/cm.

10. The method of claim 1, wherein the metal clusters has a density of about $5 \times 10^{13}$ to $1 \times 10^{19}/cm^2$.

11. The method of claim 1, further comprising:

forming a metal layer on the heat insulating layer; and removing the metal layer after crystallizing the amorphous silicon layer.

12. The method of claim 11, wherein the thermal treatment is performed at a temperature of less than about 450 degrees celsius.

13. The method of claim 10, wherein the metal clusters are formed by one of evaporation, sputtering and chemical vapor deposition.

14. The method of claim 1, wherein the amorphous silicon layer is formed by plasma enhanced chemical vapor deposition.

15. The method of claim 1, wherein the heat insulation layer has a thickness of less than about 2,000 Å.

* * * * *